United States Patent [19]

Stone

[11] Patent Number: 4,869,625

[45] Date of Patent: Sep. 26, 1989

[54] COMBINATION DRILLING AND SKIVING TOOL

[75] Inventor: William J. Stone, Kansas City, Mo.

[73] Assignee: The United States of America as represented by the United States Department of Energy, Washington, D.C.

[21] Appl. No.: 251,485

[22] Filed: Sep. 30, 1988

[51] Int. Cl.$^4$ .............................................. B23B 51/08
[52] U.S. Cl. .................................. 408/118; 408/191; 408/194; 408/224
[58] Field of Search ................................... 408/20–22, 408/26, 224–226, 117–199, 191–194; 7/107, 158

[56] References Cited

U.S. PATENT DOCUMENTS

| | | |
|---|---|---|
| 1,041,675 | 10/1912 | Robinson . |
| 2,345,403 | 3/1944 | McGrew ................................ 77/6 |
| 2,767,412 | 10/1956 | Berkey ................................ 10/140 |
| 2,797,421 | 7/1957 | Williams et al. .................... 10/140 |
| 2,948,000 | 8/1960 | Borland ................................ 10/1 |
| 3,233,260 | 2/1966 | Halpern ............................... 10/140 |
| 3,877,099 | 4/1975 | Halpern ............................... 10/140 |
| 3,995,969 | 12/1976 | Fleming .............................. 408/12 |

*Primary Examiner*—Steven C. Bishop
*Attorney, Agent, or Firm*—George H. Libman; James H. Chafin; Judson R. Hightower

[57] ABSTRACT

A combination drilling and skiving tool including a longitudinally extending hollow skiving sleeve slidably and concentrically mounted on a right-handed twist drill. Dogs or pawls provided on the internal periphery of the skiving sleeve engage with the helical grooves of the drill. During a clockwise rotation of the tool, the drill moves downwardly and the sleeve translates upwardly, so that the drill performs a drilling operation on a workpiece. On the other hand, the drill moves upwardly and the sleeve translates downwardly, when the tool is rotated in a counter-clockwise direction, and the sleeve performs a skiving operation. The drilling and skiving operations are separate, independent and exclusive of each other.

12 Claims, 2 Drawing Sheets

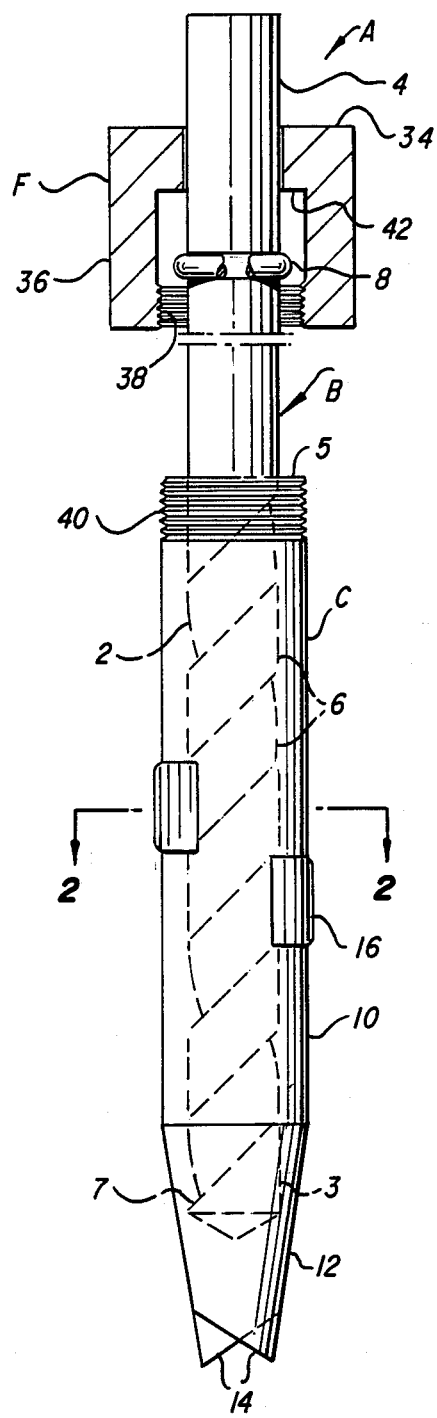
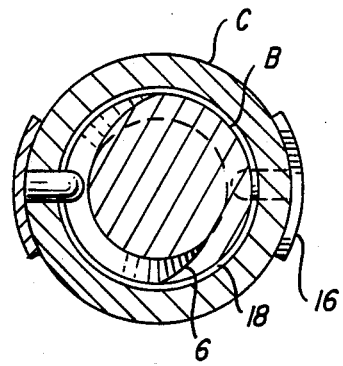
Fig. 1
Fig. 2

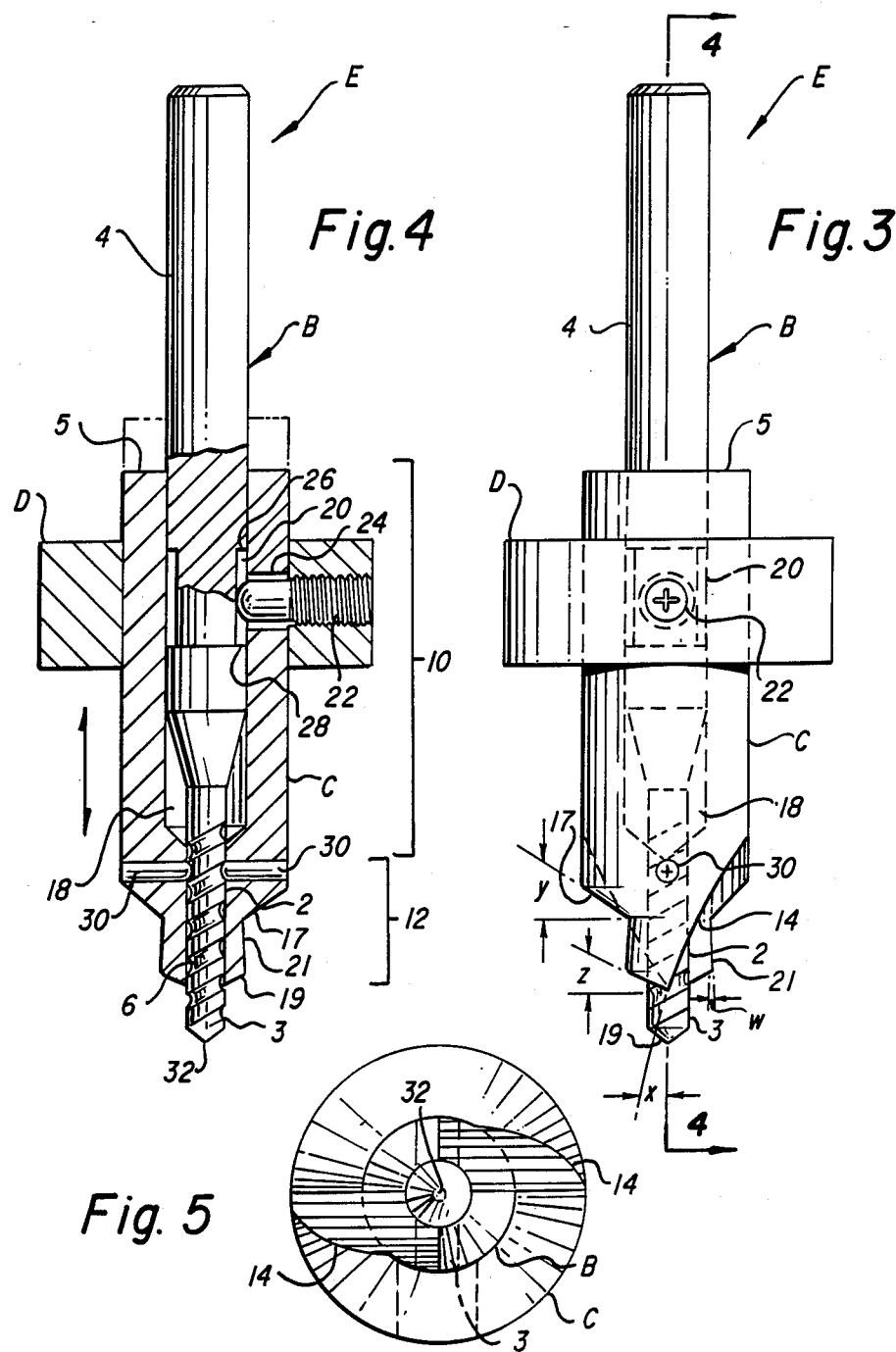

COMBINATION DRILLING AND SKIVING TOOL

FIELD AND HISTORICAL BACKGROUND OF THE INVENTION

The present invention relates generally to drilling and skiving tools and more particularly to a combination drilling and skiving tool to be used in manufacturing process for electronic printed circuit boards and the like. The Government has rights in this invention pursuant to contract No. DE-AC04-76DP00613 between the U.S. Department of Energy and Allied-Signal Inc.

It is known in the electronics industry to use generally flat flexible cables and printed circuits made of metal foil conductors laminated between thin sheets of plastic insulating film. Generally, the circuit pattern of an etched metal foil is embedded into plastic laminates for chemical protection and electrical insulation. However, these embedded conductors must be exposed for subsequent electrical connections by, for example, soldering. In order to accomplish this, the dielectric overlayers must be removed at the desired locations in order to make the necessary electrical connections.

Conventionally, a known procedure called "skiving" is used in order to remove the over-layer, and expose and burnish the connection site without excessively removing the metallic land. In the accepted manufacturing procedure, a second and separate operation is then performed to drill a hole about the center of the skived area, where a connection wire or the like is inserted and soldered from the skived side. Presently, these two procedures, i.e., skiving and drilling, are performed by two separate tools and, therefore, require additional time and effort on the part of the operator, and add additional handling and manufacturing costs associated with two different tools for carrying out these operations. Examples of some of the tools used in this and related industries are disclosed in the U.S. Pat. Nos. 1,041,675; 2,345,403; 2,767,412; 2,797,421; 2,948,000; 3,233,260; 3,877,099; and 3,995,969.

There is, however, a need for a single tool which performs the skiving as well as the drilling operation.

OBJECTS AND SUMMARY OF THE INVENTION

The principal object of this ivnention is to provide a tool which performs both the skiving and the drilling operations.

An object of the present invention is to provide a tool which substantially reduces an operator's time and effort, handling and other manufacturing costs, and improves the quality of the products made by the tool of the present invention.

Another object of the present invention is to provide a tool which does not require changing of tools in between skiving and drilling operations.

It is yet another object of the present invention to provide a tool which simplifies the electrical joint preparation algorithms to enhance the probability of objective automation of flexible laminated circuitry in CIM formats.

An additional object of the present invention is to provide a tool which performs the skiving operation when rotated in a counter-clockwise direction and performs the drilling operation when rotated in a clockwise direction.

A further object of the present invention is to provide a tool in which the skiving and drilling operations are two separate, independent and exclusive operations.

Yet another object of the present invention is to provide a tool in which the clockwise rotation causes the skiving sleeve to slide upwardly on the drill shaft thereby exposing the drilling point, and the counter-clockwise rotation causes the skiving member of the tool to slide downwardly thereby retracting the drilling member of the tool.

In summary, the object of the present invention is to provide a single tool which performs two separate, independent and exclusive drilling and skiving operations.

BRIEF DESCRIPTION OF THE DRAWINGS

The above and other objects and advantages and novel features of the present invention will become apparent from the following detailed description of the preferred embodiments of the invention illustrated in the accompanying drawings, in which:

FIG. 1 is an elevational view of the tool of the present invention;

FIG. 2 is an enlarged cross-sectional view taken along line 2—2 of FIG. 1;

FIG. 3 is an elevational view of a second embodiment of the present invention;

FIG. 4 is a partial cross-sectional view taken along line 4—4 of FIG. 3; and

FIG. 5 is an enlarged end view of the tool of FIG. 3.

DETAILED DESCRIPTION OF THE INVENTION

As shown in FIG. 1, the combination drilling and skiving tool A of the present invention includes a right-handed twist drill B and a hollow cylindrically shaped skiving sleeve C slidably mounted thereon. The drill B is a standard, commercially available right-handed twist drill which includes a lower drilling portion 2 and an upper shaft portion 4 connected to a drill press or a driver or the like (not shown). The upper shaft portion 4 extends substantially beyond top edge 5 of sleeve C in order to provide sufficient clearance for the upward movement of sleeve C thereon. The lower drilling portion 2 is provided with helical grooves 6 which run or spiral in the clockwise direction, and the shaft portion 4 is provided with a ring 8 or the like member which limits the upward axial movement of sleeve C during operation.

The sleeve C is a hollow, vertically extending cylindrically shaped member having an internal diameter generally larger than the diameter of drill B so that it can be slidably, concentrically mounted thereon. Preferably, sleeve C is eloxed to shape from a tungsten carbide rod stock and then ground and honed to a negative raked left-handed two-fluted end mill. The sleeve C includes a body portion 10 and a lower skiving or cutting portion 12 which is provided with, preferably, two generally transversely extending and diametrically opposed skiving blades or lips 14.

As shown in FIG. 1, sleeve C includes two generally diametrically opposed dog members 16 disposed axially offset from each other on the periphery thereof, which extend radially toward interior cavity 18 of sleeve C and engage with helical grooves 6 of drill B. It would be apparent to those skilled in the art that when drill B is rotated in a clockwise direction, the dogs 16, traveling in grooves 6, will cause sleeve C to translate upwardly, thereby exposed drill end portion 3 of drill B. Similarly, the counter-clockwise rotation of drill B will cause sleeve C to translate downwardly thereby, in effect, retracting drilling portion 2.

A generally cup-shaped cap F is slidably mounted on the upper shaft portion 4 of twist drill B. The cap F includes an upper portion 34 and a downwardly extending skirt portion 36. On a portion of the internal periphery of cap F, threads 38 are provided which engage with corresponding threads 40 on a portion of the external periphery of skiving sleeve C. During a downward sliding movement of sleeve C, internal surface 42 of cap F comes to abut ring 8, thereby keeping sleeve C from sliding-off twist drill B. The relative positions of cap F and ring 8 on drill B may be varied in order to accommodate the operator's specifications, and to obtain a desired limit of downward translation of sleeve C along drill B.

An alternative embodiment of the present combination drilling and skiving tool E is shown in FIGS. 3-5. (In this embodiment, various parts which are similar to the parts of the first embodiment have been designated by same reference numerals). The drill E is similar to drill A of the first embodiment, except that an axially extending radial groove 20 is provided in the upper shaft portion 4 of the drill B, which defines a limit of the sliding range of skiving sleeve C thereon. Preferably, groove 20 has a length of about 0.15". The sleeve C, preferably, has a diameter of about 0.5", and a length of about 0.80", f which body portion 10 is about 0.6" and skiving portion 12 is about 0.20".

As illustrated in FIG. 4, skiving portion 12 of sleeve C includes two plane surfaces 17 and 19 connected by section 21, which are inclined inwardly toward the central longitudinal axis of tool E at an angle of about 45° and 20°, respectively, indicated at "Y" and "Z". Preferably, section 21 may be cone-shaped, with the narrow end pointing toward disk collar D, and having an angle of about 1° indicated at "W". In the second embodiment, the rake angle of blades 14 shown at "X", is of the order of about 15° negative.

As shown in FIGS. 3 and 4, sleeve C is slidably mounted on the drill B and is held in place by disc-shaped collar D with a set-screw 22 radially extending through the periphery thereof. The set-screw 22 travels through a radially extending hole 24 is sleeve C and is received in groove 20. In addition to joining drill B and sleeve C, collar D provides the necessary inertia to sleeve C during upward and downwardly movement thereof. The set-screw 22 travels between the upper and lower edges 26 and 28 of the groove 20, to thereby limit the upward and downward sliding movement of sleeve C.

Sleeve C further includes two pawl members 30 mounted generally diametrically opposite to each other, adjacent the cutting portion 12, which extend into the interior cavity 18 thereof. The pawls 30 are made of a suitable material, such as brass, and penetrate into the helical grooves 6 of drill B. As the dogs 26 of the first embodiment, pawls 30 travel in grooves 6 and impart a twisting motion to sleeve C as it translates along drill shaft 4. In effect, sleeve C becomes a nut sliding on the helical grooves 6 of drill B.

Although, as illustrated herein, the drill B is caused to rotate in the clockwise direction and the skiving sleeve C is caused to rotate in the counter-clockwise direction, in order to perform drilling and skiving operations, respectively, it would be apparent to those of ordinary skill in the art that these directions may be reversed to carry out the same operations with the same efficiency and result.

USE AND OPERATION

In use, the combination drilling and skiving tool A or E is mounted in a vertical drill press and when the drill press revolves or rotates in a counter-clockwise direction, the gravity and the rotational inertia forces cause sleeve C to axially translate downwardly on drill shaft 4. It would be apparent to those of ordinary skill in the art that in the case of the first embodiment, sleeve C will translate downwardly until one of the dogs 16 reaches the lower most limit 7 of the helical grooves 6 on drill B. On the other hand, a downward movement of sleeve C in the second embodiment would be limited by the lower edge 28 of groove 20 as set-screw 22 will come to abut lower edge 28. This counter-clockwise motion, in effect, retracts drill end point 32 with sleeve C and locks the two tools together.

In the next step of the operation, tool A is lowered to contact a workpiece (not shown) however, since drill B is retracted, only the skiving blades 14 contact the workpiece and blades 14 skive or scrap the dielectric over-layer. When the skiving operation is complete, the drilling and skiving tool A may be raised and the drill press caused to rotate in the clockwise direction.

The rotation of tool A or E in the clockwise direction causes dogs 16 (first embodiment), and pawls 30 (second embodiment), to travel upwardly in the respective helical grooves 6, thereby causing sleeve C to move upwardly. The upward translation of sleeve C on drill B exposes lower drill end portion 3. Once again, tool A is lowered to contact the previously skived area on the workpiece. It should be noted that if sleeve C is not sufficiently retracted, drill point 32 and blades 14 both may contact the workpiece, however, no skiving is done as sleeve C is negatively raked and blades 14 rotate backwardly without harming the disposed metal area. Additionally, the sliding friction of the sledding action of blades 14 along with the moment of inertia of sleeve C causes it to translate upwardly on drill shaft 4, such that only drill B effectively engages the workpiece to thereby drill a hole therein. Although not shown, a weak helical spring or the like may be installed within cavity 18, or about a suitable location, to facilitate upward and/or downward translation of sleeve C on drill B.

The combination drilling and skiving tool of the present invention is unique in that it performs separate, independent and exclusive drilling and skiving operations by rotating in clockwise and counter-clockwise directions, respectively. Since the drilling the skiving operations are independent and exclusive of each other, it is possible to obtain various established operational parameters, such as RPM, feed rate, feed loads, etc., thereby eliminating the need for devising new parameters and methods for establishing the new parameters.

From the above, it can be seen that the combination drilling and skiving tool of the present invention provides an efficient and easy method for performing skiving and drilling operations; substantially reduce operator's time and effort; requires only one tool instead of two separate tools, thereby reducing handling and other manufacturing costs; and which drills a well-aligned concentric hole through an already skived interconnection site on a workpiece.

While this invention has been described as having the preferred designs, it is understood that it is capable of further modifications, uses and/or adaptations of the invention and following in general the principles of the invention and including such departures from the present disclosure as have come within known or customary practice in the art to which the invention pertains, and as may be applied to central features hereinbefore set forth, and fall within the scope of invention or the limits of the claims appended hereto.

What is claimed is:

1. A combination drilling and skiving tool comprising:
   (a) a twist drill rotatable in a first direction for performing a drilling operation, said twist drill having an axially aligned shaft portions and helically-grooved drilling portion;
   (b) skiving means operably associated with said twist drill and rotatable in a second direction for performing a skiving operation, said skiving means comprising a hollow longitudinal sleeve concentrically mounted on for movement along said twist drill, said sleeve including at least one dog member radially extending into and slidably engaging with said grooved drilling portions;
   (c) said skiving means being axially translatable on said twist drill such that when the tool is rotated in the first direction said dog member carries said skiving means towards said shaft portion and said twist drill performs a drilling operation, and when the tool is rotated in the second directon said dog member carries and skiving means away from said shaft portion and said skiving means perform a skiving operation independent and exclusive of the drilling operation.

2. The tool of claim 1, wherein:
   (a) said twist drill comprises a right-handed twist drill.

3. The tool of claim 1, wherein:
   (a) said shaft portion including means for limiting axial movement thereof relative to said sleeve.

4. The tool of claim 1, wherein:
   (a) said twist drill having a shaft portion and a helically-grooved portion; and
   (b) said shaft portion including a radially extending axial groove.

5. The tool of claim 4, further comprising:
   (a) means for securing said sleeve onto said twist drill.

6. The tool of claim 5, wherein:
   (a) said securing means comprising a disk-shaped collar having a first radially extending hole.

7. The tool of claim 6, wherein:
   (a) said sleeve including an upper portion and a lower portion;
   (b) said upper portion including a second radially extending hole generally aligned with said first hole; and
   (c) screw means positioned in said first and second holes and extending into said groove.

8. The tool of claim 7, wherein:
   (a) said lower portion of said sleeve including at least one pawl member extending therein; and
   (b) said pawl member engaging with said helically-grooved portion of said twist drill.

9. The tool of claim 1, wherein:
   (a) said sleeve including a generally cylindrical body portion and a cutting portion; and
   (b) said cutting portion including skiving blades.

10. The tool of claim 9, wherein:
    (a) said blades extending generally transversely to the longitudinal axis of the device and having a negative rake angle of about 15°.

11. A combination drilling and skiving tool comprising:
    (a) a twist drill having a shaft portion including an axially extending radial groove and a helically grooved portion; and
    (b) a generally hollow longitudinal sleeve detachably mounted on said twist drill and axially translatable thereon, said sleeve including a dog member extending radially into said extending groove to limit axial movement of said sleeve, and first and second opposed pawl members extending radially into said helically grooved portion;
    (c) whereby when the tool is rotated in a first direction said twist drill performs a drilling operation, and when the tool is rotated in a second direction said sleeve performs a skiving operation independent and exclusive of the drilling operation.

12. The tool of claim 11, wherein:
    (a) said first and second opposed pawl members are disposed axially offset from each other.

* * * * *